United States Patent [19]
Kondo

[11] Patent Number: 6,010,947
[45] Date of Patent: Jan. 4, 2000

[54] SEMICONDUCTOR DEVICE AND METHOD FOR MANUFACTURING

[75] Inventor: Toshiyuki Kondo, Yokohama, Japan

[73] Assignee: Kabushiki Kaisha Toshiba, Kawasaki, Japan

[21] Appl. No.: 08/893,918

[22] Filed: Jul. 11, 1997

[30] Foreign Application Priority Data

Jul. 16, 1996 [JP] Japan ..................................... 8-185790

[51] Int. Cl.[7] .................................................. H01L 21/76
[52] U.S. Cl. .......................... 438/435; 438/437; 438/692; 438/424; 148/DIG. 50
[58] Field of Search ................................... 438/424, 427, 438/435, 437, 692; 148/DIG. 50

[56] References Cited

U.S. PATENT DOCUMENTS

| | | | |
|---|---|---|---|
| 4,531,282 | 7/1985 | Sakai et al. | 438/365 |
| 5,290,396 | 3/1994 | Schoenborn et al. | 438/427 |
| 5,362,669 | 11/1994 | Boyd et al. | 438/427 |
| 5,554,256 | 9/1996 | Pruijmboom et al. | 156/643.1 |
| 5,578,518 | 11/1996 | Koike et al. | 438/426 |
| 5,712,185 | 1/1998 | Tsai et al. | 438/424 |
| 5,736,462 | 4/1998 | Takahashi et al. | 438/425 |
| 5,766,823 | 6/1998 | Fumitomo | 438/437 |

*Primary Examiner*—Trung Dang
*Attorney, Agent, or Firm*—Loeb & Loeb LLP

[57] ABSTRACT

An end portion of a trench isolating region has a shape of steps so that a residual gate material can be easily removed and it is possible to prevent from conducting between gates. An oxide film 2, a first stopper 3 and a second stopper 4 are formed on a semiconductor substrate 1 (FIG. 1A). The materials of the first and second stoppers may be selected from materials having different oxidation rates, materials having different isotropic etching rates and the combinations thereof. Then, a resist is formed by patterning, and then, the anisotropic etching of the second stopper 4 of a silicon nitride layer, the first stopper 3 of a polycrystal silicon, the oxide film 2 and the semiconductor substance 1 is carried out (FIG. 1B). After peeling off the resist 7, oxidation is carried out by tens nm to form an oxide film 5 (FIG. 1C). At this time, since the first stopper 3 is made of a material which is easily oxidized, the oxide film 5 grows in a lateral direction to be formed therein. Then, a $SiO_2$ or the like is deposited and implanted to form an insulating film 6 (FIG. 3D). Then, the insulating film 6 is polished by the CMP (FIG. 3E), and the first and second stoppers 3 and 4 are peeled off using the isotropic etching (FIG. 3F).

6 Claims, 12 Drawing Sheets

SEMICONDUCTOR DEVICE AND METHOD FOR MANUFACTURING

BACKGROUND OF THE INVENTION

The present invention relates generally to a semiconductor device and a method for manufacturing the semiconductor device. More specifically, the invention relates to a semiconductor device which uses a stopper portion having a laminated structure of two kinds of materials or more in the chemical mechanical polishing (CMP) when forming a trench isolating region, and a method for manufacturing the semiconductor device.

Conventionally, the isolation of elements such as a MOS transistor has been carried out by forming a field insulator in, e.g., the local oxidation of silicon method (the LOCOS method). This performs isolation/diffusion and forms a field oxide film by the thermal oxidation using $Si_3N_4$ covering a device portion as a mask.

Recently, in addition to this, a method for forming an insulating film by the trench isolation has been noticed. In the LOCOS method, a dimensional pattern shift is generated by bird's beaks. However, in this method, a delicate patterning can be achieved because such a bird's beak is not formed. This method has, e.g., the following advantages in comparison with the LOCOS method.

(1) There is little difference in level between an element forming region (a device portion) and an element isolating region (a field portion), so that the device is flat.
(2) When patterning, a large margin of lithography can be ensured to obtain a large manufacturing margin, so that it is advantageous in a semiconductor process.
(3) The insulating film is deeply buried, so that it is possible to isolate devices even in a delicate design.

FIGS. 11A through 11F schematically show steps in a conventional method for manufacturing a semiconductor device by the trench isolation.

The method for manufacturing a semiconductor device by the trench isolation includes a CMP step in which a stopper protecting an active layer in a polishing step is provided. Usually, this stopper is made of, e.g., a polycrystal silicon or a silicon nitride, and is formed so as to have a structure of only monolayer. Such a manufacturing method will be described below.

Figure 11A:
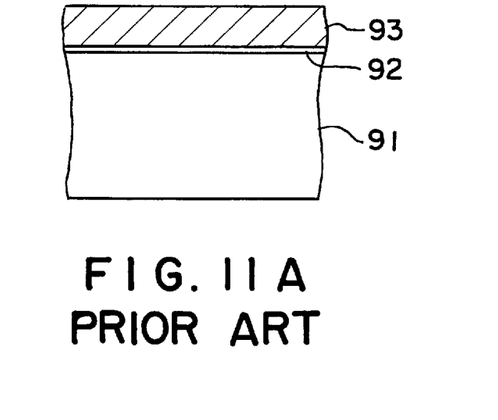
FIGS. 11A through 11F are schematic views illustrating steps in a conventional method for manufacturing a semiconductor device by the trench isolation.
Figure 11B:
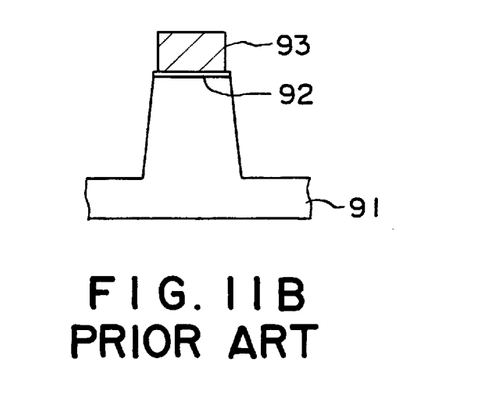
Figure 11C:
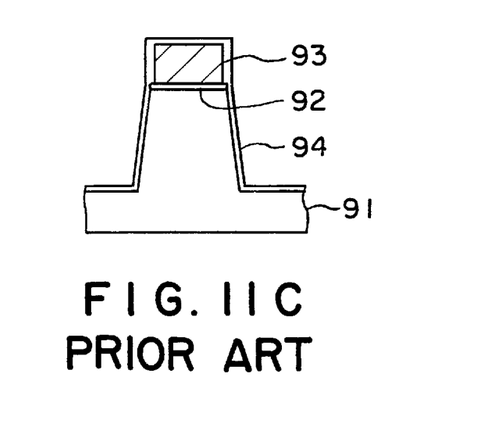
Figure 11D:
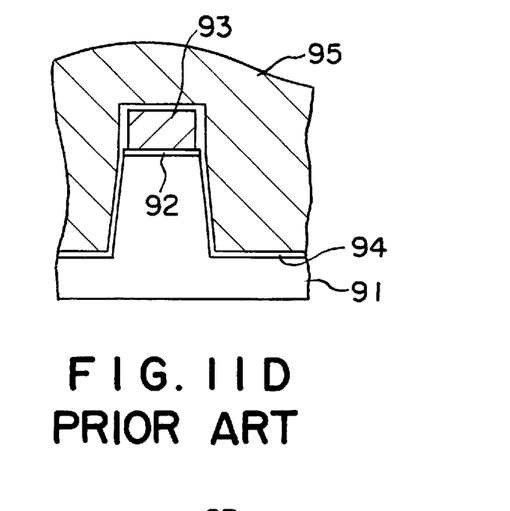
Figure 11E:
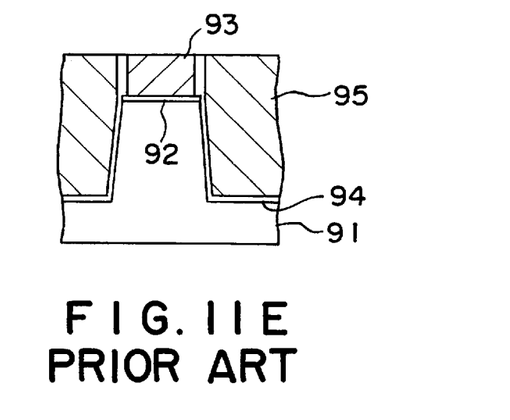

First, as shown in FIG. 11A, a semiconductor substrate 91 of silicon or the like and an oxide film 92 are formed. Then, a stopper 93 for use in the CMP is deposited thereon. The material of the stopper 93 may be, e.g., a polycrystal silicon, a silicon nitride ($Si_xN_y$) or the like. Thereafter, as shown in FIG. 11B, an element isolating region is patterned using the optical lithography or the like, and then, a trench is formed by, e.g., the anisotropic etching. As shown in FIG. 11C, the interior of the trench and so forth are oxidized to form an oxide film 94. Then, as shown in FIG. 11D, an insulating film 95 of, e.g., $SiO_2$, is deposited on the whole surface of the substrate. Thereafter, as shown in FIG. 11E, the etchback and the flattening are simultaneously carried out by the CMP step. After the CMP is completed, the stopper 93 is peeled off by the isotropic etching to completely form an element isolating region as shown in FIG. 11F.

Figure 11F:
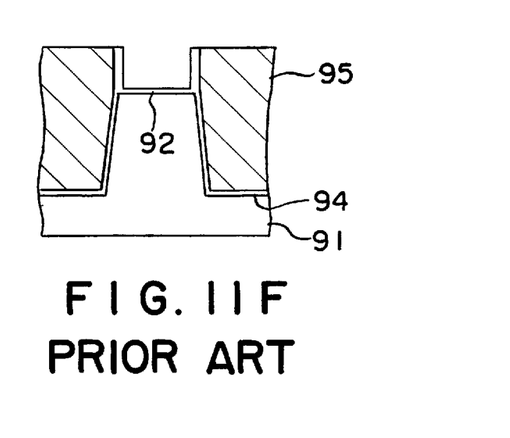

As shown in FIG. 11F, in the conventional method, the field end has a difference in level. In general, the stopper for use in the CMP step needs a certain thickness (for example, about several hundred nanometers). When the uniformity of the CMP is poor, the polishing depth may be different for every location of one wafer, i.e., for every element forming region. As a result, a great difference in level may occur at a certain location.

SUMMARY OF THE INVENTION

It is therefore an object of the present invention to prevent a gate material from remaining at a corner of a difference in level in a step of forming a gate electrode and to prevent from conducting between gates by improving the shape of an end portion (a field end) of an element isolating region so as to easily remove the residual gate material when using the CMP in the trench isolation. Specifically, it is an object of the present invention to provide a field end having a shape of two steps or one step which has a slight difference in level.

It is another object of the present invention to increase a processing margin of a gate electrode, with respect to the over etching, the difference in level in a device region and so forth in a step of forming a gate electrode.

In order to accomplish the aforementioned and other objects, according to the present invention, a stopper for use in the CMP has a laminated structure of materials having different oxidation rates or different isotropic etching rates (e.g., a polycrystal silicon and a silicon nitride), so that a field end has a shape of two steps after peeling off the stopper for the CMP.

According to one aspect of the present invention, there is provided a method for manufacturing a semiconductor device which has an trench isolating region between adjacent element forming regions, the method comprising the steps of: forming a first thin stopper on a semiconductor substrate, the first stopper being used for a chemical mechanical polishing; forming a second thin stopper on the first stopper, the second stopper having a lower oxidation rate or a lower isotropic etching rate than that of the first stopper; oxidizing or isotropic etching to form a step so that the width of the first stopper is less than the width of the second stopper due to a difference between oxidation rates or isotropic etching rates of the first and second stoppers; depositing an insulating film on the semiconductor substrate; and forming an buried insulating film in the trench isolating region by removing the first and second stoppers after carrying out the chemical mechanical polishing using the first and second stoppers as references.

According to another aspect of the present invention, there is provided a semiconductor device which has a trench isolating region formed between adjacent element forming regions by a chemical mechanical polishing, wherein an implanted insulating film has a plurality of steps, the difference in level between adjacent steps being a slight difference which corresponds to a value obtained by dividing the thickness of a stopper necessary to serve as a cutting margin in the chemical mechanical polishing; and wherein the plurality of steps decrease the width of the element forming region decreases from the surface of the implanted insulating film toward the surface of the semiconductor substrate so that the buried insulating film has a step-shaped end.

BRIEF DESCRIPTION OF THE DRAWINGS

The present invention will be understood more fully from the detailed description below and from the accompanying drawings of the preferred embodiments of the invention. However, the drawings are not intended to imply limitation of the invention to specific embodiments, but are for explanation and understanding only.

In the drawings.

DESCRIPTION OF THE PREFERRED EMBODIMENTS

For more clearly understanding the features and advantageous of the present invention, related problems caused by the great difference in level mentioned above will be briefly explained below.

After the semiconductor device is formed as shown in FIG. 11F, a step of forming a gate electrode may be carried out. In this case, such a great difference in level may cause problems.

Figure 12A:
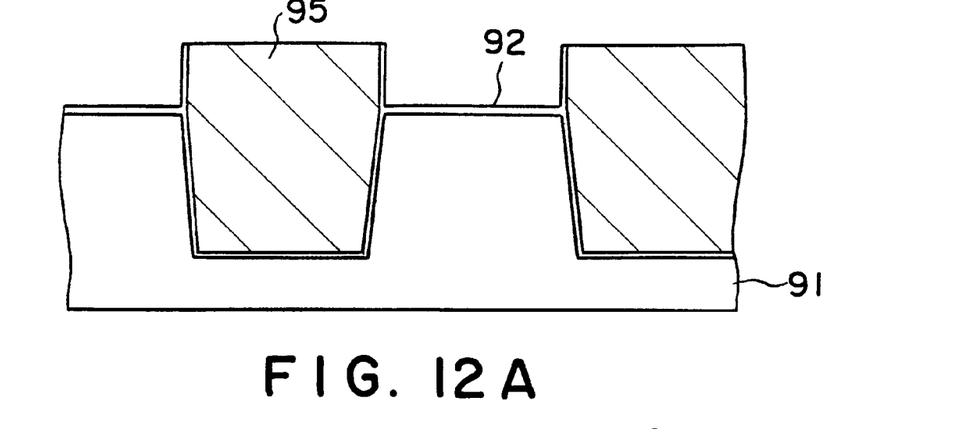
FIGS. 12A through 12C are schematic views illustrating conventional steps of forming a gate electrode.
Figure 12B:
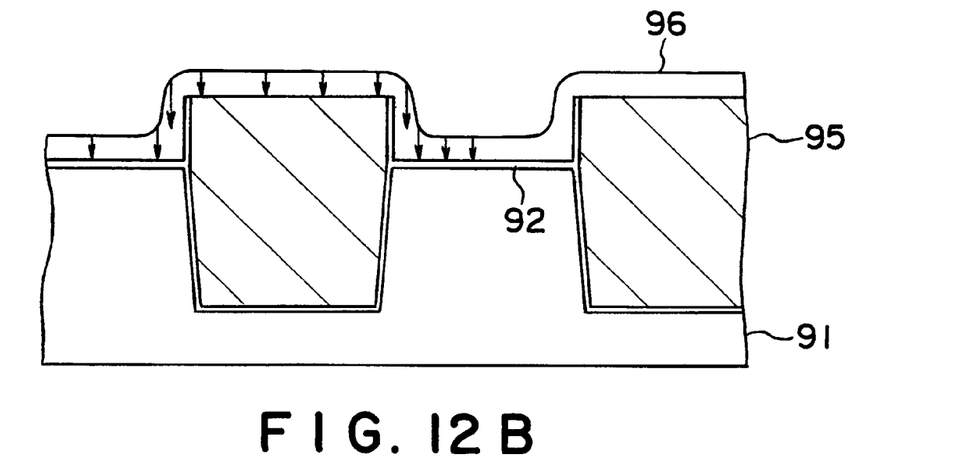
Figure 12C:
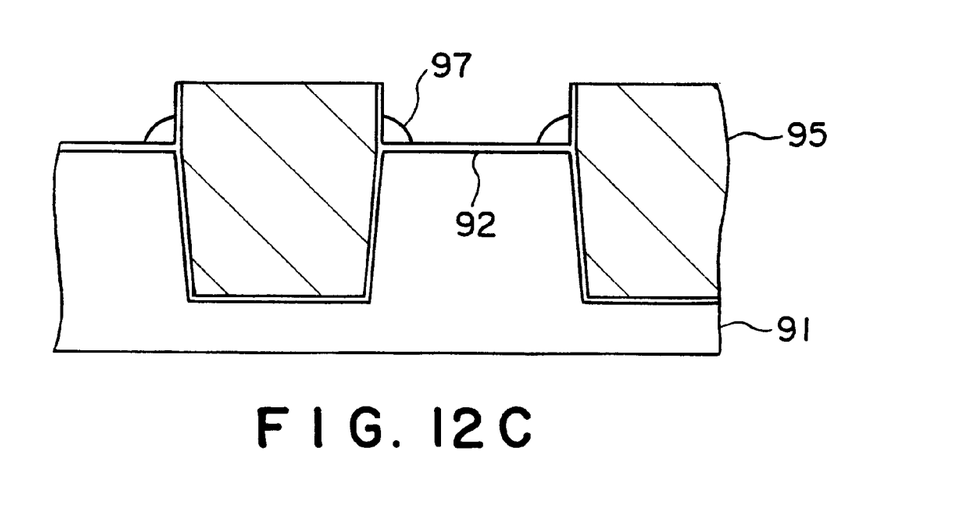

FIGS. 12A through 12C schematically show conventional steps of forming a gate electrode.

FIG. 12A shows a cross section of an element forming region element-isolated by the buried insulating film 95. Then, as shown in FIG. 12B, a gate material 96, such as a polycrystal silicon, is deposited and patterned, and the anisotropic etching is carried out, by the reactive ion etching (RIE) or the like, to a certain depth as shown by the arrow in the drawing. Although over etching is carried out in most cases, the etched amount is limited to an extent by which the substrate is not damaged. For that reason, as shown in FIG. 12C, even after etching the gate material, the residual gate material 97 remains at the corner of a location, at which the great difference in level occurs, at the end portion of the buried insulating film 95 in the element forming region.

Figure 13:
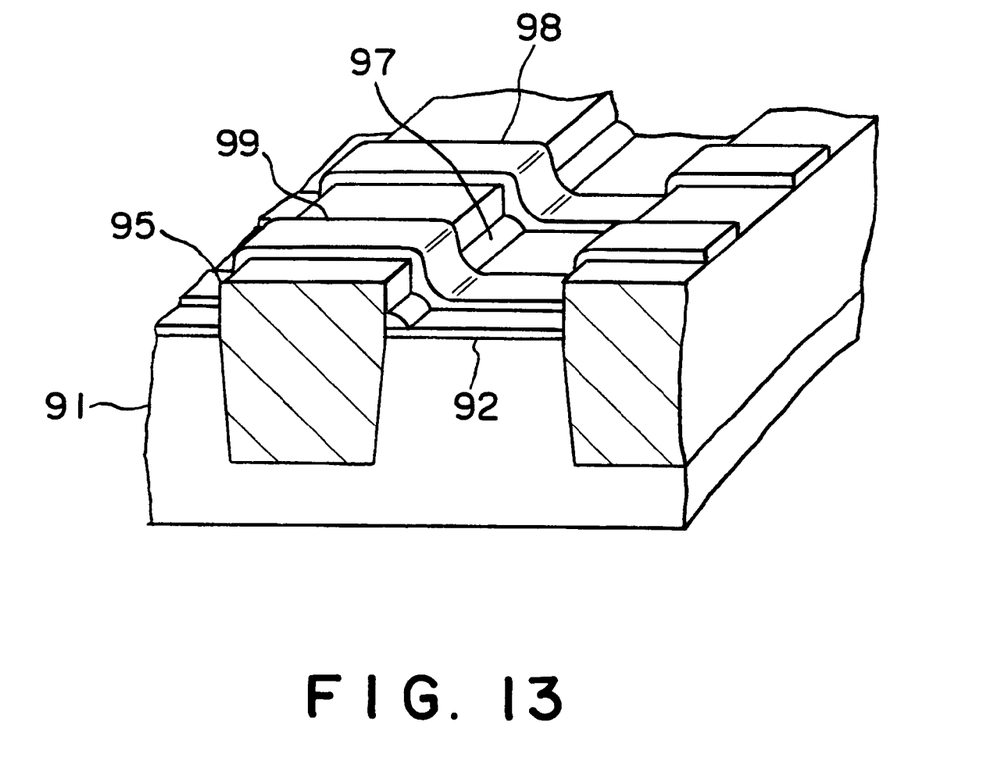
FIG. 13 is a view explaining a short-circuit between gate electrodes due to the residual gate material.

FIG. 13 shows a short-circuit between gate electrodes caused by the residual gate material.

As shown in FIG. 13, electrodes 98 and 99 should be formed by the patterning. However, the residual gate material 97, which was not removed by the etching as mentioned above, conducts between the patterned gate electrodes 98 and 99. The gate electrodes 98 and 99 must be essentially isolated from each other, so that it is disadvantageous for the residual gate material to conduct between adjacent gate electrodes.

Comparing the problems aforementioned and referring to the accompanying drawings, the preferred embodiments of the present invention will be described below.

FIGS. 1A through 1F schematically show steps in the first preferred embodiment of a method for manufacturing a semiconductor device according to the present invention.

Figure 1A:
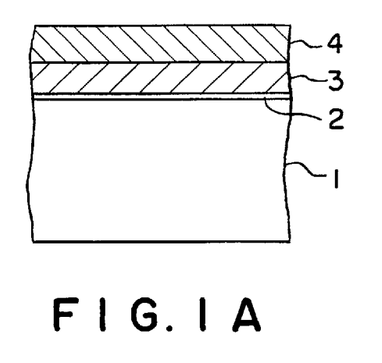
FIGS. 1A thorough 1F are schematic views illustrating steps in the first preferred embodiment of a method for manufacturing a semiconductor device according to the present invention.

As shown in FIG. 1A, an oxide film 2 having a thickness of, e.g., about 10 to about 20 nm, is formed on a semiconductor substrate 1 of silicon or the like. A polycrystal silicon or the like having a thickness of, e.g., about 100 to about 150 nm, is deposited on the oxide film 2 to form a first stopper 3. Then, a silicon nitride $S_xN_y$ (which will be hereinafter simplified to refer to as a "SiN") having a thickness of about 200 to about 250 nm is deposited thereon to form a second stopper 4. As the materials of the stoppers, a silicon material, such as amorphous silicon, may be substituted for the polycrystal silicon. The materials of the first and second stoppers may be suitably selected from materials having different oxidation rates, materials having different isotropic etching rates and the combinations thereof. In this preferred embodiment, materials having different oxidation rates are selected (these materials also have different isotropic etching rates). The thickness of each of the first and second stoppers is determined by the margin for processing the stopper and by the CMP conditions. The thickness of each of the stoppers must have a cutting margin in view of the dispersion in amount to be polished by the CMP. While a stopper of a sufficient thickness has been formed of one kind of material in conventional methods, it is formed of two kinds of materials according to the present invention. Therefore, the thickness of each of the first and second stoppers can be decreased to substantially half of that in the conventional methods. In addition, each of the stoppers must be sufficiently thin in order to prevent the residual gate material from remaining as in the conventional methods.

Figure 1B:
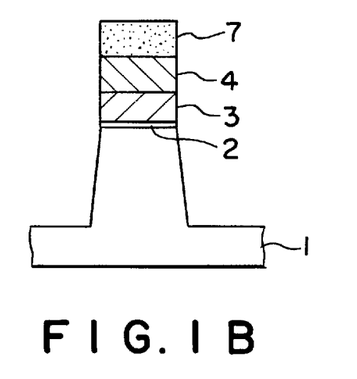

Then, an element isolating region is patterned using the optical lithography or the like to form a resist 7. Thereafter, as shown in FIG. 1B, the second stopper 4 of the SiN layer, the first stopper 3 of the polycrystal silicon, the oxide film 2 and the semiconductor substrate 1 are sequentially etched by the anisotropic etching. A portion, which is not covered by the resist 7, is not removed by the etching to serve as an element forming region (a device region). On the other hand, a region removed by the etching serves as an element isolating region (a field region).

Figure 1C:
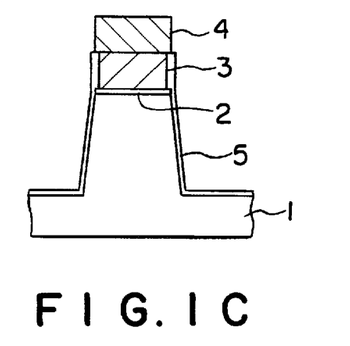

Then, as shown in FIG. 1C, after peeling off the resist 7, oxidation is carried out by tens nm to form an oxide film 5. At this time, since the first stopper 3 is made of a material which is easily oxidized, the oxide film 5 grows in a lateral direction to be formed therein. On the other hand, since the second stopper is made of a material which is difficult to oxidize, the oxide film 5 is not formed (or difficult to be formed) therein.

Figure 1D:
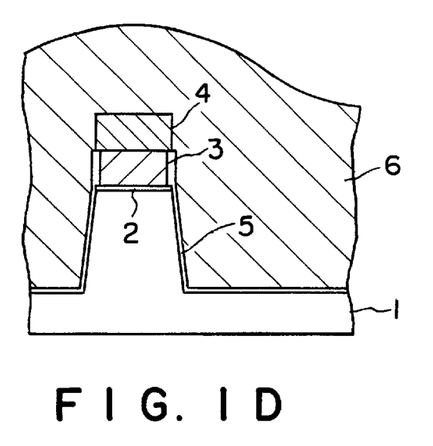
Figure 1E:
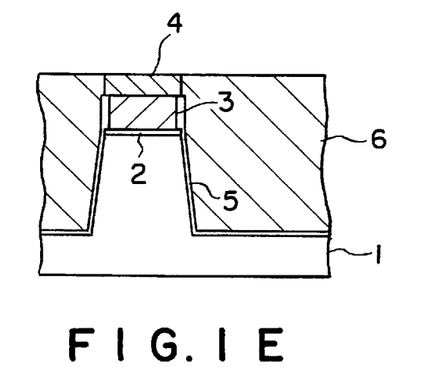

Then, as shown in FIG. 1D, a SiO₂ or the like is deposited to form an insulating film 6. Thereafter, as shown in FIG. 1E, the CMP is carried out to polish the insulating film 6 so that the etchback and the flattening are carried out. For example, the CMP is carried out until the first and second stoppers are exposed to the outside.

Figure 1F:
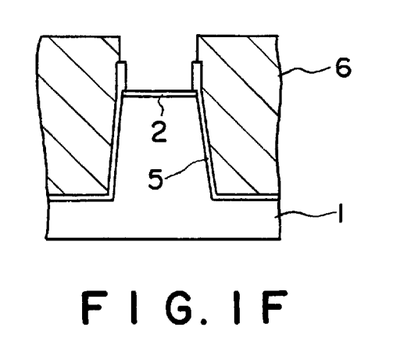

Then, as shown in FIG. 1F, after the CMP is completed, the first and second stoppers 3 and 4 are peeled off using the isotropic etching. At this time, the field end has a shape of two steps. As mentioned above, the thickness of each of the steps can be decreased to substantially half of the thickness of the conventional stoppers.

In addition, when the uniformity of the CMP is not sufficient, the polishing depths may be different at locations even in one wafer. For that reason, the conventional stopper has had a sufficient thickness. However, according to the present invention, since the stopper has a two-step laminated structure, the first stopper 3 is also polished at some locations in the CMP step shown in FIG. 1E.

Figure 2A:
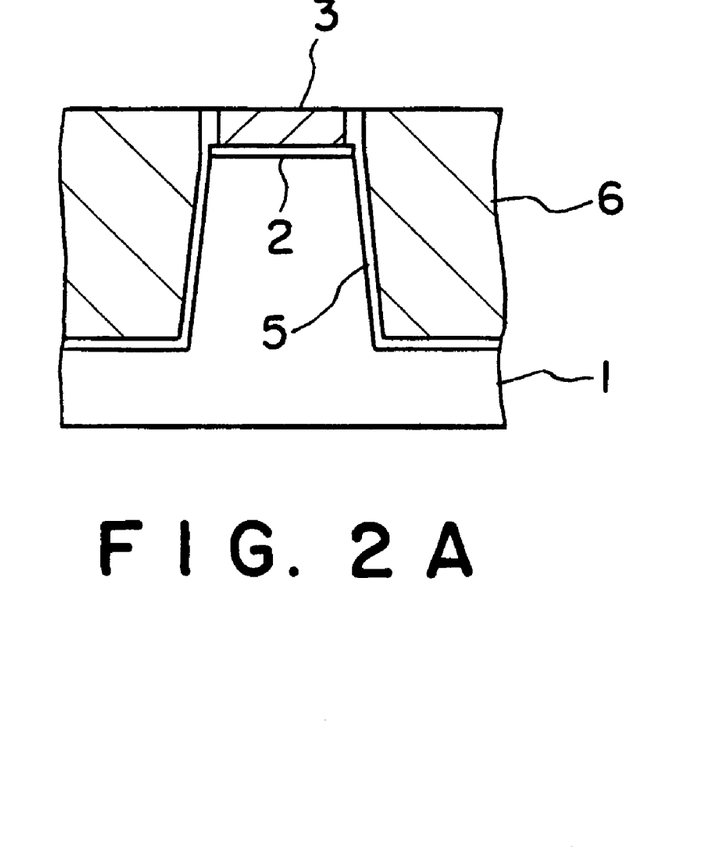
FIGS. 2A and 2B are cross sectional views illustrating steps wherein the polishing is carried out until a first stopper of a polycrystal silicon or the like is exposed to the outside.
Figure 2B:
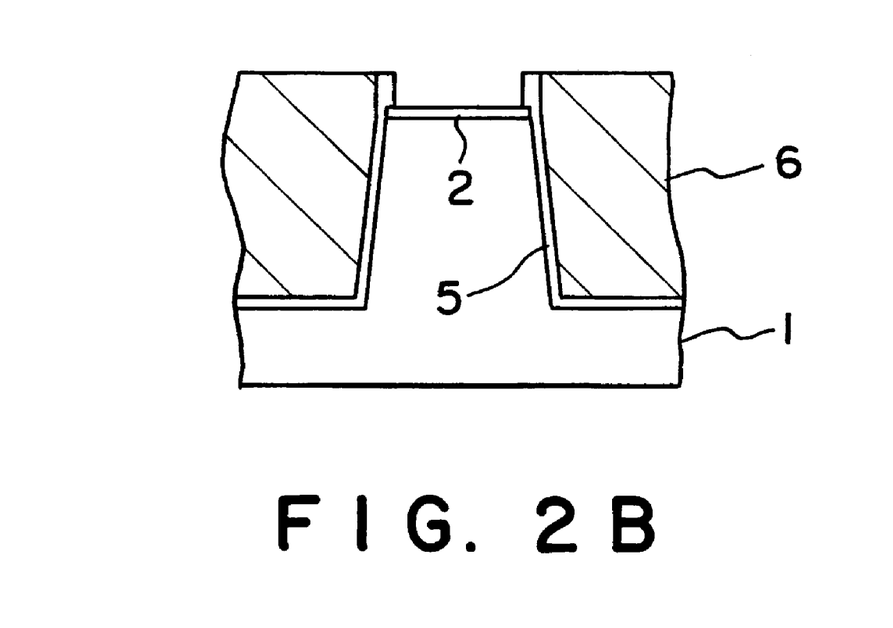

FIGS. 2A and 2B are cross sectional views of the semiconductor device in a case where it is polished until the first stopper of the polycrystal silicon or the like is exposed. FIGS. 2A and 2B show an modification corresponding to FIGS. 1E and 1F.

In this case, as shown in FIG. 2A, only the first stopper 3 remains to form a one-step stopper. However, as mentioned above, the first stopper 3 is sufficiently thin in view of the residual gate material. Therefore, as shown in FIG. 2B, after the first stopper 3 is removed, the difference in level at the field end is sufficiently small.

In the next step, a gate material, such as a polycrystal silicon, is deposited on the manufactured semiconductor substrate. Then, the patterning is carried out, and the anisotropic etching and so forth are carried out by the RIE or the like. In this case, since the difference in level at the field end is small at locations of the two steps, no residual gate material remains at the corner thereof. Therefore, it is possible to prevent conducting between the patterned gate materials, so that there is no problem in the subsequent gate-electrode processing.

Figure 3A:
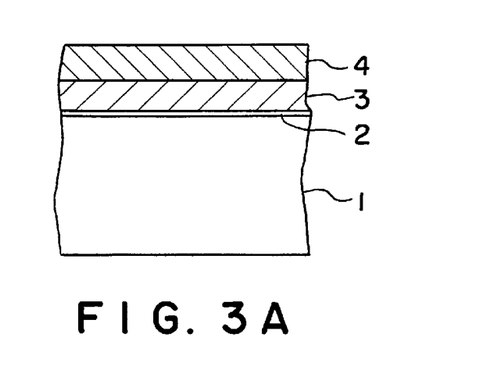
FIGS. 3A through 3F are schematic views illustrating steps in the second preferred embodiment of a method for manufacturing a semiconductor device according to the present invention.

FIGS. 3A thorough 3F show steps in the second preferred embodiment of a method for manufacturing a semiconductor device according to the present invention.

As shown in FIG. 3A, similar to the first preferred embodiment, an oxide film 2 is laminated on a semiconductor substrate 1 of silicon or the like. Then, a polycrystal silicon or the like having a thickness of, e.g., about 100 to about 150 nm, is deposited thereon to form a first stopper 3, and a SiN or the like having a thickness of, e.g., about 200 to about 250 nm, is deposited thereon to form a second stopper 4. In this preferred embodiment, materials having different isotropic etching rates are selected as the materials of the first and second stoppers The conditions such as the thickness of the first and second stoppers 3 and 4 are the same as those in the first preferred embodiment.

Figure 3B:
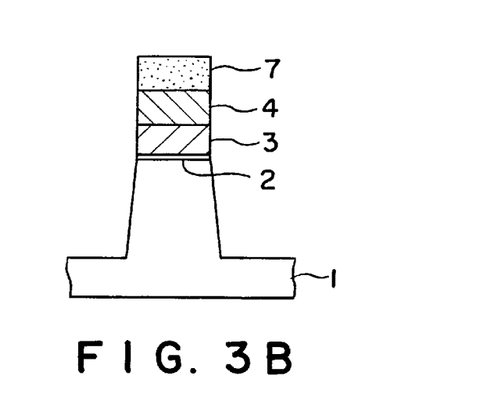

Then, an element isolating region is patterned using the optical lithography or the like to form a resist 7. Thereafter, as shown in FIG. 3B, the second stopper 4 of the SiN layer, the first stopper 3 of the polycrystal silicon, the oxide film 2 and the semiconductor substrate 1 are sequentially etched by the anisotropic etching. A portion, which is not covered by the resist 7, is not removed to serve as an element forming region (a device region). On the other hand, a region removed by the etching serves as an element isolating region (a field region).

Figure 3C:
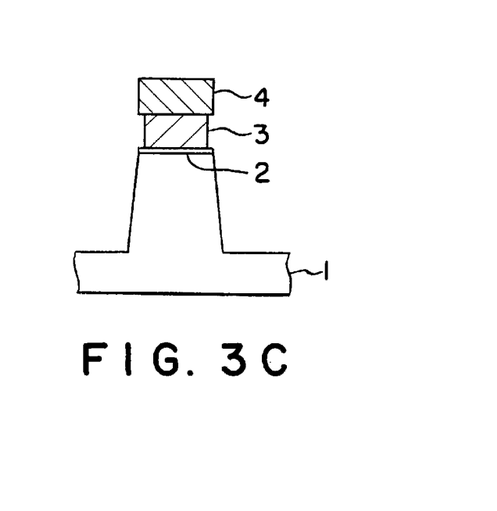

Then, as shown in FIG. 3C, the first stopper 3 of the polycrystal silicon is etched by, e.g., tens nm, using the isotropic etching. When the isotropic etching is carried out, although the first stopper 3 is etched in a lateral direction since it is made of a material which is easy to etch, the second stopper 4 is not etched (or difficult to be etched) since it is made of a material which is difficult to etch. Furthermore, it is possible to consequently form a shape of two steps by changing the etching conditions.

Figure 3D:
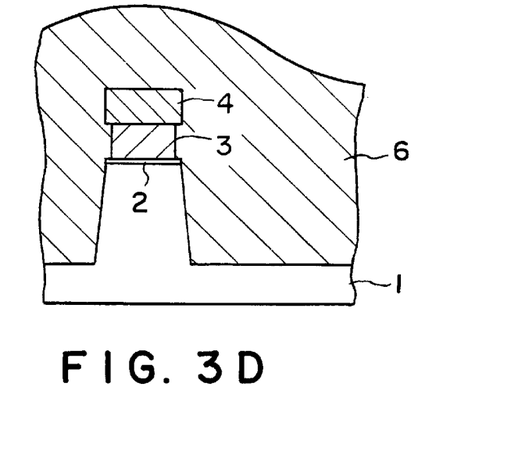
Figure 3E:
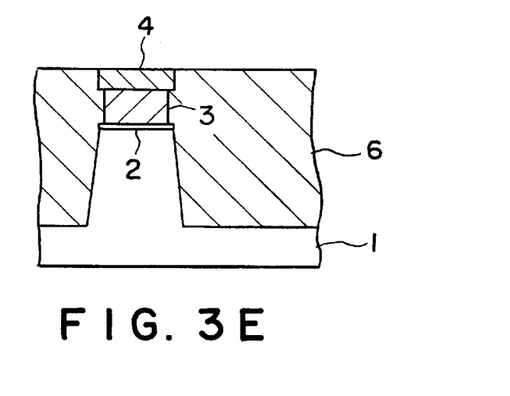
Figure 3F:
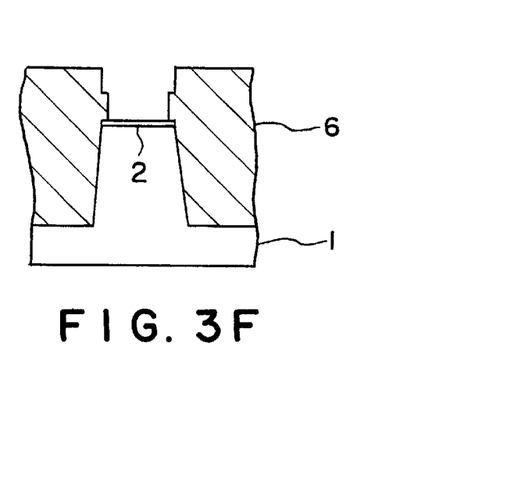

Thereafter, the same steps as those in the first preferred embodiment are carried out. That is, as shown in FIG. 3D, a SiO₂ or the like is deposited and buried form an insulating film 6. Then, as shown in FIG. 3E, the CMP is carried out to polish the insulating film 6 so that the etchback and the flattening are carried out. In the drawing, the CMP is carried out until the second stopper is exposed to the outside. Then, as shown in FIG. 3E, after the CMP is completed, the first and second stoppers 3 and 4 are peeled off using the isotropic etching.

At this time, the field end has a shape of two steps. As mentioned above, the thickness of each step can be decreased to substantially half of the thickness of the conventional stoppers. In addition, similar to the first preferred embodiment, the first stopper 3 is also polished at some locations in the CMP step shown in FIG. 3E.

FIGS. 4A through 4G schematically show steps in the third preferred embodiment of a method for manufacturing a semiconductor device according to the present invention. In this preferred embodiment, a trench isolating region is divided into two layers, i.e., a layer above a stopper and a layer below the stopper, so that the layers are separately etched. In addition, the difference between the isotropic etching rates of first and second stoppers is utilized to form a step-like structure of a field end.

Figure 4A:
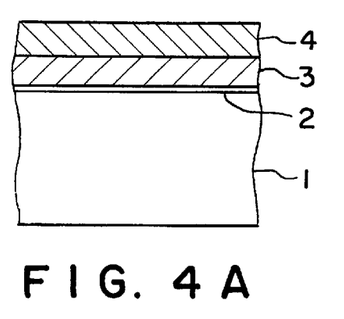
FIGS. 4A through 4G are schematic views illustrating steps in the third preferred embodiment of a method for manufacturing a semiconductor device according to the present invention.

As shown in FIG. 4A, an oxide film 2 having a thickness of, e.g., about 10 to about 20 nm, is formed on a semiconductor substrate 1 of silicon or the like. Then, a polycrystal silicon or the like having a thickness of, e.g., about 100 to about 150 nm, is deposited on the oxide film 2 to form a first stopper 3. Moreover, a SiN or the like having a thickness of, e.g., about 200 to about 250 nm, is deposited thereon to form a second stopper 4. The materials of the first and second stoppers may be suitably selected from materials having different oxidation rates, materials having different isotropic etching rates and the combinations thereof. In this preferred embodiment, materials having different isotropic etching rates are selected. The conditions such as the thickness of the first and second stoppers 3 and 4 are the same as those in the first preferred embodiment.

Figure 4B:
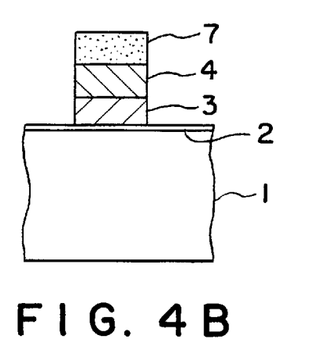

Then, an element isolating region is patterned using the optical lithography to form a resist 7. Thereafter, as shown in FIG. 4B, the second stopper 4 of the SiN layer and the first stopper 3 of the polycrystal silicon are sequentially etched by the anisotropic etching. In this case, it is required to prevent the oxide film 2 and the semiconductor substrate 1 from being etched. A portion, which is not covered by the resist 7, is not removed to serve as a device region. On the other hand, a region removed by the etching serves as an element isolating region (a field region).

Figure 4C:
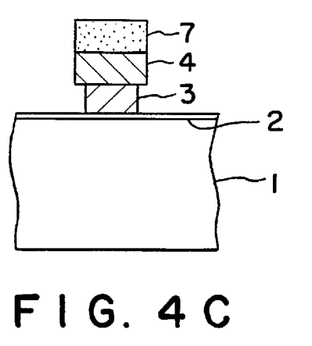

Then, as shown in FIG. 4C, the first stopper 3 of the polycrystal silicon is etched by, e.g., tens nm, using the isotropic etching. In the isotropic etching, although the first stopper 3 is etched in a lateral direction since it is made of a material which is easy to etch, the second stopper 4 is not etched (or difficult to etch) since it is made of a material which is difficult to be etched. Furthermore, it is possible to consequently form a shape of two steps by changing the etching conditions.

Figure 4D:
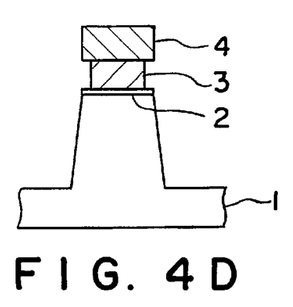

Thereafter, as shown in FIG. 4D, the oxide film 2 and the semiconductor substrate 1 are etched by the anisotropic etching to peel off the resist 7.

Figure 4E:
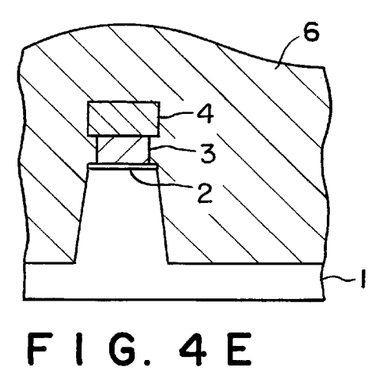
Figure 4F:
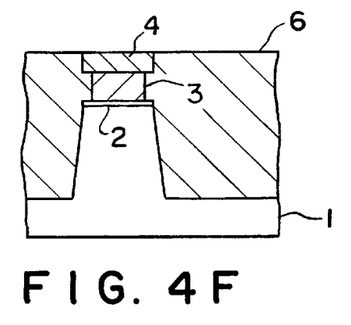
Figure 4G:
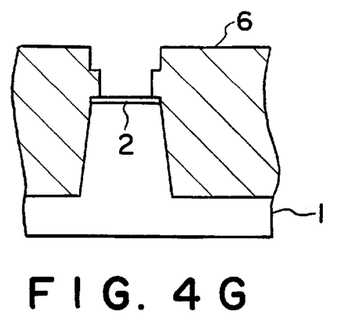

Then, the same steps as those in the first preferred embodiment are carried out. That is, as shown in FIG. 4E, a $SiO_2$ or the like is deposited and buried to form an insulating film 6. Thereafter, as shown in FIG. 4F, the CMP is carried out to polish the insulating film 6 so that the etchback and the flattening are carried out. In the drawing, the CMP is carried out until the second stopper is exposed to the outside. Then, as shown in FIG. 4G, after the CMP is completed, the first and second stoppers 3 and 4 are peeled off using the isotropic etching.

At this time, the field end has a shape of two steps. As mentioned above, the thickness of each step can be decreased to substantially half of the thickness of the conventional stoppers. In addition, similar to the first preferred embodiment, the first stopper 3 is also polished at some locations in the CMP step shown in FIG. 4F.

After peeling off the resist 7 as shown in FIG. 4D, oxidation may be carried out by, e.g., tens nm. FIGS. 5A through 5D schematically show steps in a case where oxidation is carried out. FIGS. 5A through 5D show a modification corresponding to FIGS. 4D through 4G, respectively.

Figure 5A:
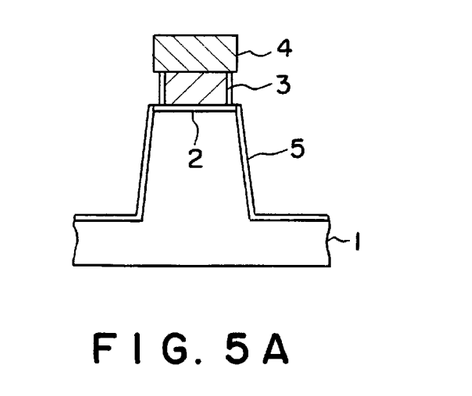
FIGS. 5A thorough 5D are schematic views illustrating steps wherein oxidation is carried out in the third preferred embodiment.
Figure 5B:
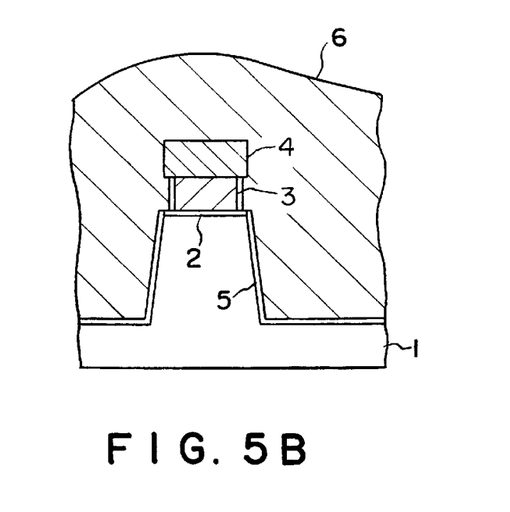
Figure 5C:
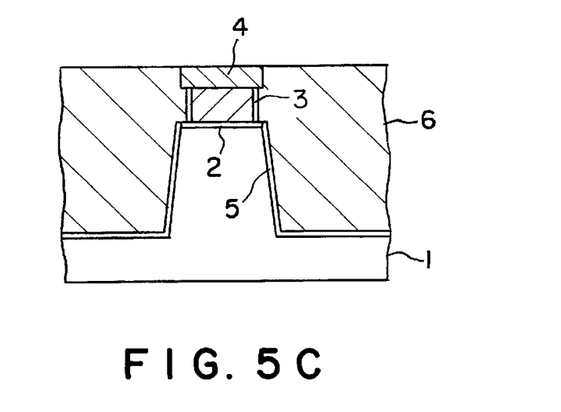
Figure 5D:
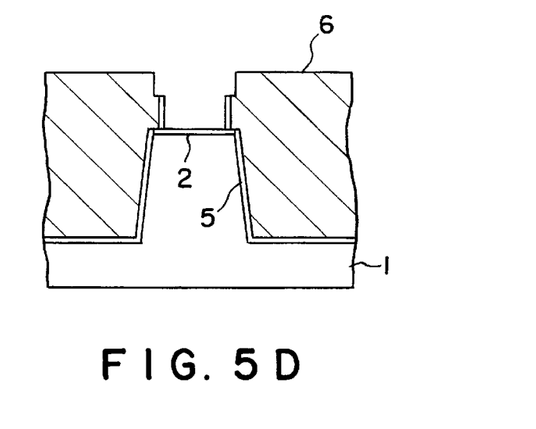

In this case, as shown in FIG. 5A, an oxide film 5 is formed on a first stopper 3. The reason why no oxide film is formed on a second stopper 4 is that a material, which is difficult to be oxidized, is selected. Thereafter, similar to FIGS. 4E through 4G, a step of depositing an oxide film 6 shown in FIG. 5B, a CMP step shown in FIG. 5C, and a step of removing the first and second stoppers 3 and 4 shown in FIG. 5D are carried out to form a semiconductor substrate.

FIGS. 6A through 6G schematically show steps in the fourth preferred embodiment of a method for manufacturing a semiconductor device according to the present invention. In this preferred embodiment, an trench isolating region is divided into two layers, i.e., a layer above a stopper and a layer below the stopper, so that the layers are separately etched. In addition, the difference between the oxidation rates of first and second stoppers is utilized to form a step-like structure of a field end.

Figure 6A:
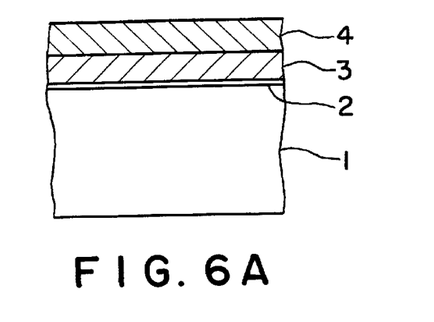
FIGS. 6A through 6G are schematic views illustrating steps in the fourth preferred embodiment of a method for manufacturing a semiconductor device according to the present invention.

Similar to the third preferred embodiment, as shown in FIG. 6A, an oxide film 2 is formed on a semiconductor substrate 1 of silicon or the like. Then, a polycrystal silicon or the like having a thickness of, e.g., about 100 to about 150 nm, is deposited thereon to form a first stopper 3. Moreover, a SiN or the like having a thickness of, e.g., about 200 to about 250 nm, is deposited thereon to form a second stopper 4. In this preferred embodiment, materials having different oxidation rates are selected as examples of the materials of the first and second stoppers. The conditions such as the thickness of the first and second stoppers 3 and 4 are the same as those in the first preferred embodiment.

Figure 6B:
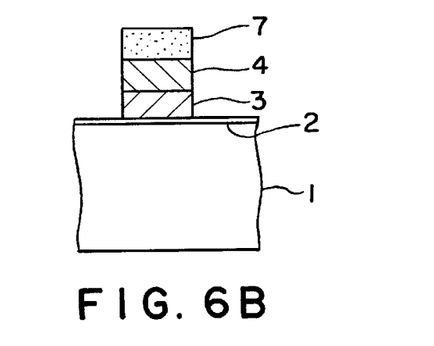

Then, as shown in FIG. 6B, an element isolating region is patterned by the optical lithography or the like to form a resist 7. Thereafter, the second stopper 4 and the first stopper 3 are etched by the anisotropic etching.

Figure 6C:
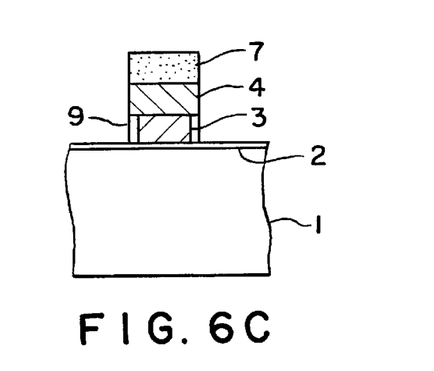

Then, as shown in FIG. 6C, oxidation is carried out by tens nm to form an oxide film 9. In this case, since the first stopper is made of a material which is easy to, be oxidized, an oxide film 9 grows in a lateral direction to be formed therein. On the other hand, since the second stopper 4 is made of a material, which is difficult to be oxidized, and since it is covered by the resist 7, the oxide film 9 is not formed (or difficult to be formed) therein.

Figure 6D:
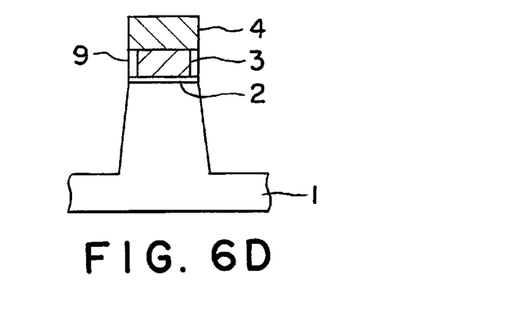

Thereafter, as shown in FIG. 6D, the resist 7 is used as a mask to etch the oxide film 2 and the semiconductor substrate 1 by the anisotropic etching, and then, the resist 7 is peeled off.

Figure 6E:
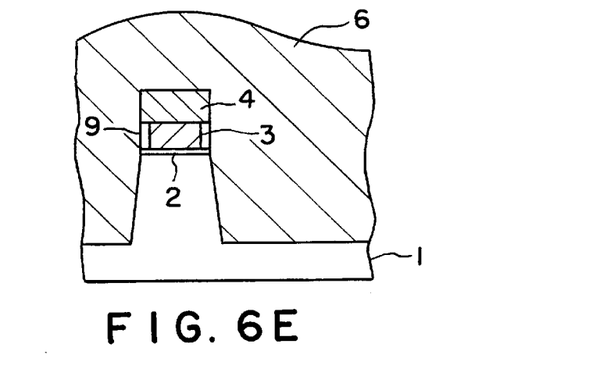
Figure 6F:
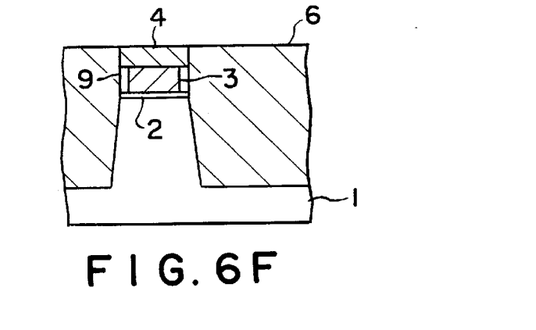
Figure 6G:
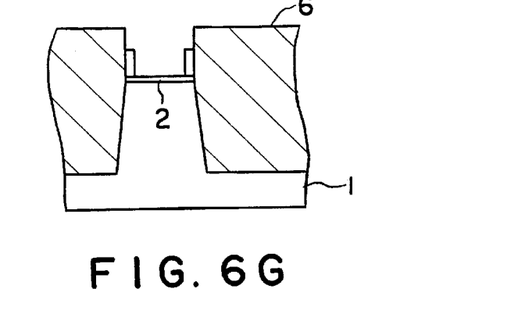

Thereafter, the same steps as those in the third preferred embodiment are carried out. That is, as shown in FIG. 6E, the CMP is carried out to polish the insulating film 6 so that the etchback and the flattening are carried out. In the drawing, the CMP is carried out until the second stopper is exposed to the outside. Then, as shown in FIG. 6G, after the CMP is completed, the first and second stoppers 3 and 4 are peeled off using the isotropic etching.

At this time, the field end has a shape of two steps. As mentioned above, the thickness of each step can be decreased to substantially half of the thickness of the conventional stoppers. In addition, similar to the first preferred embodiment, the first stopper 3 is also polished in the CMP step shown in FIG. 6F.

FIGS. 7A through 7G schematically show steps in the fifth preferred embodiment of a method for manufacturing a semiconductor device according to the present invention. In this preferred embodiment, an oxide film layer is formed on a second stopper to be used as a mask.

Figure 7A:
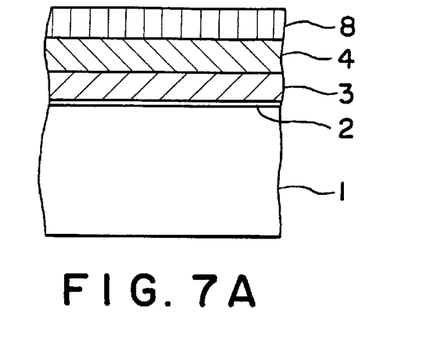
FIGS. 7A through 7G are schematic views illustrating steps in the fifth preferred embodiment of a method for manufacturing a semiconductor device according to the present invention.

As shown in FIG. 7A, an oxide film 2 having a thickness of, e.g., about 10 to about 20 nm, is formed on a semiconductor substrate 1 of silicon or the like. Then, a polycrystal silicon or the like having a thickness of, e.g., about 100 to about 150 nm, is deposited on the oxide film 2 to form a first stopper 3. Moreover, a SiN or the like having a thickness of, e.g., about 200 to about 250 nm, is deposited thereon to form a second stopper 4. The materials of the first and second stoppers may be suitably selected from materials having different oxidation rates, materials having different isotropic etching rates and the combinations thereof. In this preferred embodiment, materials having different isotropic etching rates are selected. The conditions such as the thickness of the first and second stoppers 3 and 4 are the same as those in the first preferred embodiment. In the third preferred embodiment, an oxide film 8 having a thickness of, e.g., about 300 to about 400 nm, is deposited thereon.

Figure 7B:
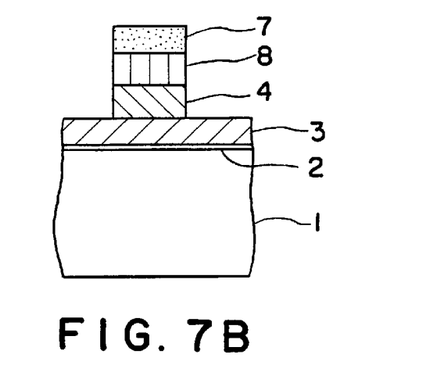

Then, as shown in FIG. 7B, an element isolating region is patterned using the optical lithography or the like to form a resist 7, and then, the oxide film 8 and the second stopper 4 of the SiN layer are etched by the anisotropic etching.

Figure 7C:
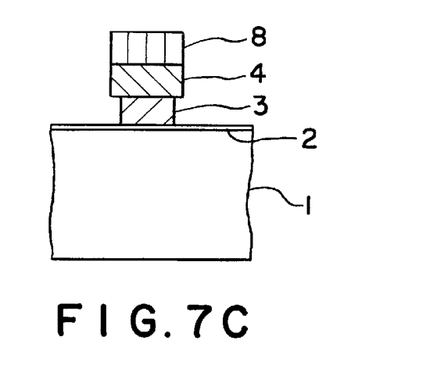
Figure 7D:
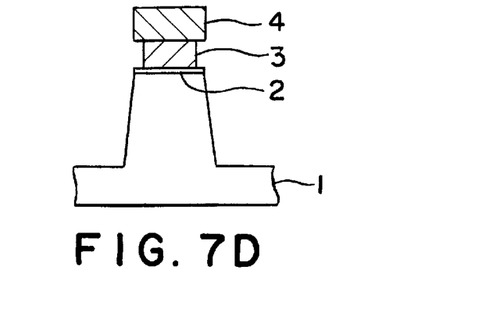

Then, as shown in FIG. 7C, the resist 7 is peeled off, and the oxide film 8 is used as a mask to carry out the isotropic etching. In this step, the first stopper 3 of the polycrystal silicon is etched by, e.g., tens nm. Since the first stopper 3 is made of a material which is easy to be etched, it is etched in a lateral direction by the isotropic etching. However, since the second stopper 4 is made of a material which is difficult to be etched and since the second stopper 4 is covered by the oxide film 8, it is not etched (or difficult to etch) by the isotropic etching. Thereafter, as shown in FIG. 7D, the oxide film 8 is used as a mask to etch the semiconductor substrate 1 by the anisotropic etching, and then, the oxide film 8 is peeled off.

Figure 7E:
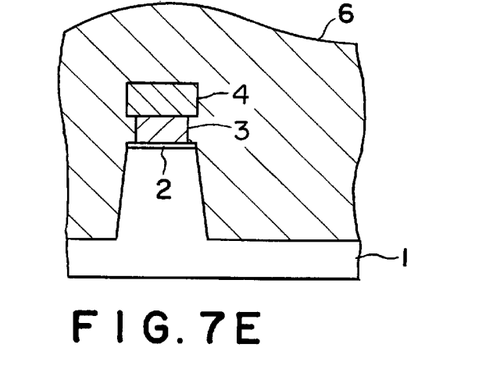
Figure 7F:
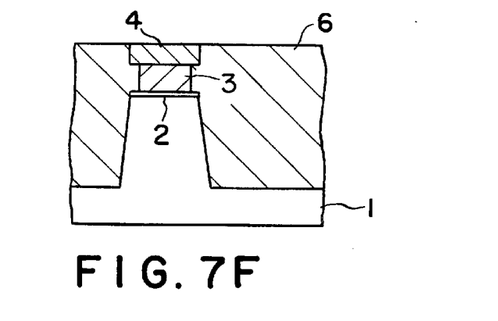
Figure 7G:
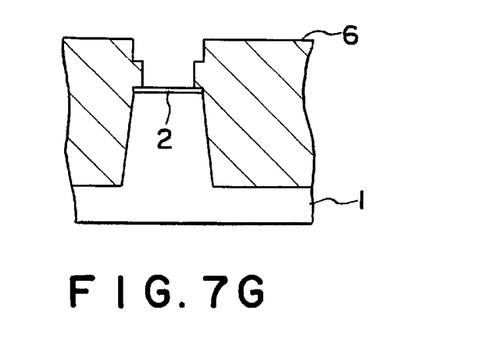

Then, the same steps as those in the first and second preferred embodiment are carried out. That is, as shown in FIG. 7E, a $SiO_2$ or the like is deposited and buried to form an insulating film 6. Thereafter, as shown in FIG. 7F, the CMP is carried out to polish the insulating film 6 so that the etchback and the flattening are carried out. In the drawing, the CMP is carried out until the second stopper is exposed to the outside. Then, as shown in FIG. 7G, after the CMP is completed, the first and second stoppers 3 and 4 are peeled off using the isotropic etching.

At this time, the field end has a shape of two steps. As mentioned above, the thickness of each step can be decreased to substantially half of the thickness of the conventional stoppers. In addition, similar to the first preferred embodiment, the first stopper 3 is also polished at some locations in the CMP step shown in FIG. 7F.

FIGS. 8A through 8H schematically show steps in the sixth preferred embodiment of a method for manufacturing a semiconductor device according to the present invention.

Figure 8A:
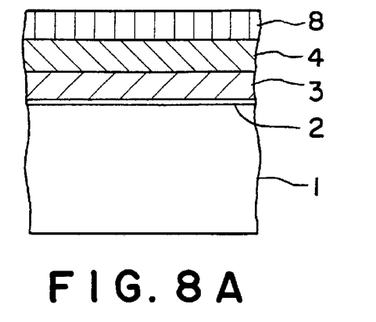
FIGS. 8A through 8H are schematic views illustrating steps in the sixth preferred embodiment of a method for manufacturing a semiconductor device according to the present invention.

Similar to the third preferred embodiment, as shown in FIG. 8A, an oxide film 2 is formed on a semiconductor substrate 1 of silicon or the like. Then, a polycrystal silicon or the like having a thickness of, e.g., about 100 to about 150 nm, is deposited thereon to form a first stopper 3. Moreover, a SiN or the like having a thickness of, e.g., about 200 to about 250 nm, is deposited thereon to form a second stopper 4. Then, an oxide film 8 having a thickness of, e.g., about 300 to about 400 nm, is deposited thereon. In this preferred embodiment, materials having different oxidation rates are selected as examples of the materials of the first and second stoppers. The conditions such as the thickness of the first and second stoppers 3 and 4 are the same as those in the first preferred embodiment.

Figure 8B:
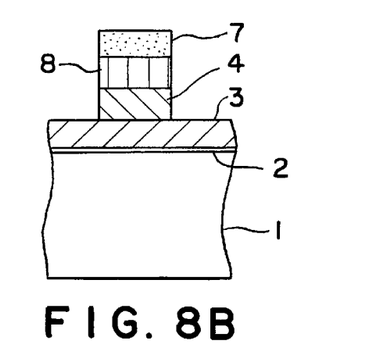

Then, as shown in FIG. 8B, an element isolating region is patterned using the optical lithography or the like to form a resist 7, and then, the oxide film 8 and the second stopper 4 of the SiN layer are etched by the anisotropic etching.

Figure 8C:
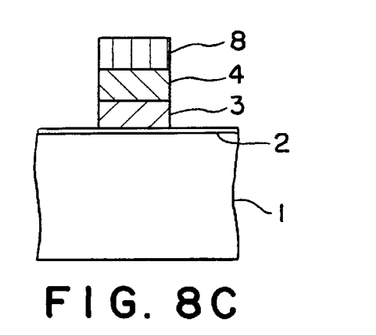

Then, as shown in FIG. 8C, the resist 7 is peeled off, and the oxide film 8 is used as a mask to carry out the anisotropic etching of the first stopper 3.

Figure 8D:
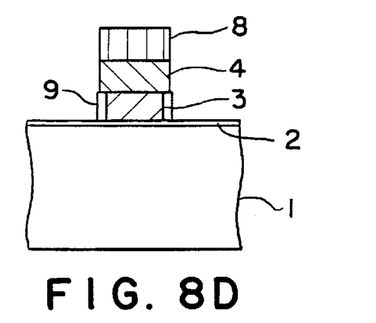

Thereafter, as shown in FIG. 8D, oxidation is carried out by tens nm to form an oxide film 9. In this case, since the first stopper 3 is made of a material which is easy to oxidize, the oxide film 9 grows in a lateral direction to be formed therein. On the other hand, since the second stopper 4 is made of a material which is difficult to oxidize and since the second stopper 4 is covered by the oxide film 8, the oxide film 9 is not formed (or difficult to form) therein.

Figure 8E:
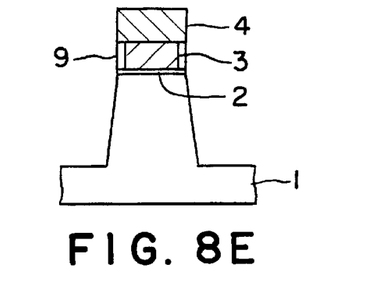

Then, as shown in FIG. 8E, the oxide film 8 is used as a mask to carry out the etching of the semiconductor substrate 1 by the anisotropic etching, and then, the oxide film 8 is peeled off.

Figure 8F:
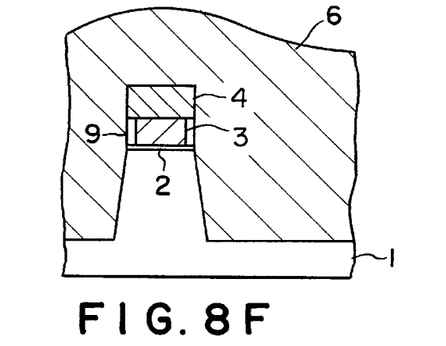
Figure 8G:
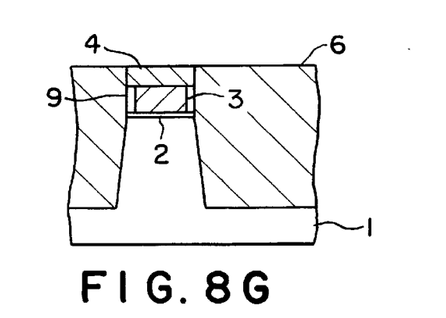
Figure 8H:
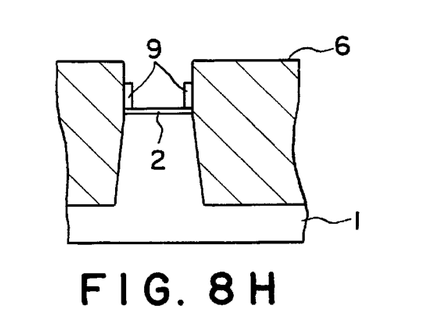

Thereafter, the same steps as those in the fifth preferred embodiment are carried out. That is, as shown in FIG. 8F, a $SiO_2$ or the like is deposited and buried to form an insulating film 6. Then, as shown in FIG. 8G, the CMP is carried out to polish the insulating film 6 so that the etchback and the flattening are carried out. In the drawing, the CMP is carried out until the second stopper is exposed to the outside. Then, as shown in FIG. 8H, after the CMP is completed, the first and second stoppers 3 and 4 are peeled off using the isotropic etching.

Figure 9A:
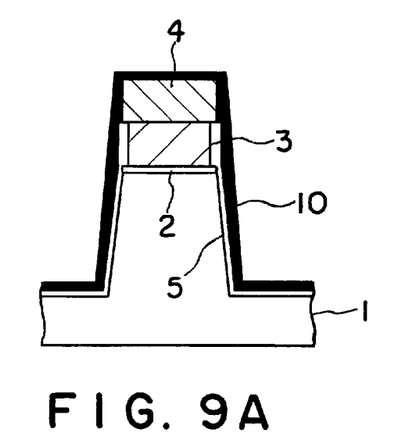
FIGS. 9A and 9B are schematic views illustrating steps wherein a liner is provided in the first preferred embodiment.
Figure 9B:
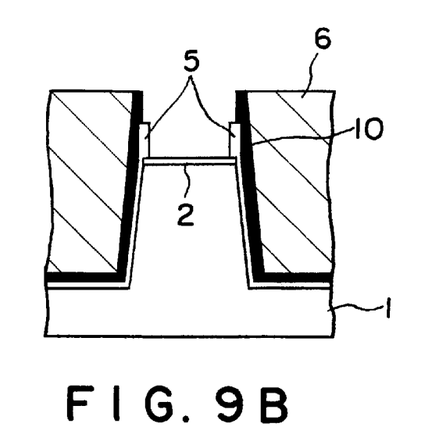

At this time, the field end has a shape of two steps. As mentioned above, the thickness of each step can be decreased to substantially half of the thickness of the conventional stoppers. In addition, similar to the first preferred embodiment, the first stopper 3 is also polished at some locations in the CMP step shown in FIG. 8G, Furthermore, in the first preferred embodiment, a liner of a SiN or the like may be laid after the step of FIG. 1C. FIGS. 9A and 9B show a liner provided in the first preferred embodiment. In this case, as shown in FIG. 9A, a liner 10 is provided after the step of FIG. 1C. Thereafter, the steps shown in FIG. 1 are carried out to form a field end having a shape of two steps end as shown in FIG. 9B. Furthermore, FIG. 9B shows a modification corresponding to FIG. 1F. The liner can be applied to the aforementioned second through sixth preferred embodiments.

Figure 10:
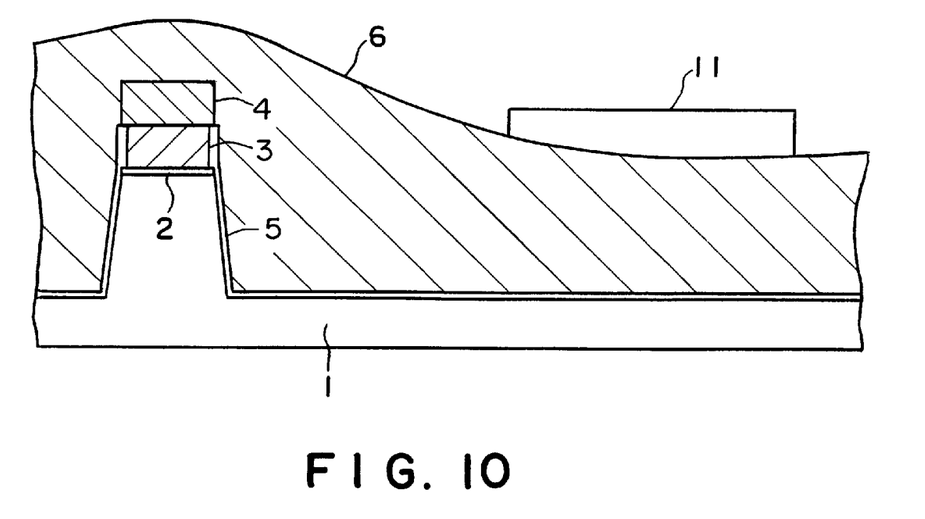
FIG. 10 is a schematic view illustrating a third stopper formed on an insulating film in the first preferred embodiment.

In addition, in the first preferred embodiment, another stopper for the CMP may be formed on the insulating film 6 in some devices after the step of FIG. 1D. FIG. 10 shows a device having a third stopper on the insulating film. In FIG. 10, a third stopper 11 is provided in the device region. The material, thickness and so forth may be suitably selected so as to be the same as those of the first and second stoppers. This can be used as an index for ensuring a sufficient thickness of the oxide film in the element isolating region, even if there is dispersion in amount to be polished by the CMP, e.g., even if the element isolating region is wide. The third stopper thus formed may be also applied to the aforementioned second through sixth preferred embodiments.

In addition, while the laminated structure of the two stoppers has been provided in the aforementioned preferred embodiments, a laminated structure of three stoppers or more may be formed. Moreover, if a concentration gradient in a longitudinal direction and so forth are provided so that the lateral depth for oxidation or etching can be sequentially ensured, the same functions and advantageous effects can be obtained by the inclined field end.

Also in the first, second and fourth through sixth preferred embodiment, as shown in FIG. 5 and the description thereof in the third preferred embodiments, after the first stopper is selectively etched by the isotropic etching, a step of carrying out oxidation may be added.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for manufacturing a semiconductor device comprising the steps of:

laminating a first thin stopper on a semiconductor substrate, said first stopper being used for a chemical mechanical polishing;

forming a second thin stopper on said first stopper, said second stopper having a lower oxidation rate than that of said first stopper;

patterning by using a resist;

anisotropic etching said second stopper, said first stopper and said semiconductor substrate in a trench isolating region, on the basis of said patterning;

oxidizing the side of said first stopper so that the width of said first stopper is less than the width of said second stopper due to a difference between oxidation rates of said first and second stoppers;

depositing an insulating film on said semiconductor substrate;

polishing said insulating film using the chemical mechanical polishing until said first or second stopper is exposed to the outside, to form a buried insulating film in said trench isolating region; and peeling off said first and second stoppers.

2. A method for manufacturing a semiconductor device as set forth in claim 1, wherein said first stopper is made of a polycrystal silicon, and said second stopper is made of a silicon nitride.

3. A method for manufacturing a semiconductor device as set forth in claim 1, which further comprises a step of forming a liner for covering an element forming region after forming an oxide film on said first stopper.

4. A method for manufacturing a semiconductor device as set forth in claim 1, which further comprises a step of forming a third stopper on said insulating film in said trench isolating region after the step of forming said insulating film.

5. A method for manufacturing a semiconductor device comprising the steps of:

forming an oxide film on a semiconductor substrate;

laminating a first thin stopper on said oxide film, said first stopper being used for a chemical mechanical polishing;

forming a second thin stopper on said first stopper, said second stopper having a lower oxidation rate than that of said first stopper;

patterning by using a resist;

anisotropic etching said second stopper and said first stopper in a trench isolating region, on the basis of said patterning;

oxidizing the side of said first stopper so that the width of said first stopper is less than the width of said second stopper due to a difference between oxidation rates of said first and second stoppers;

anisotropic etching said oxide film and said semiconductor substrate in said trench isolating region on the basis of said patterning;

depositing an insulating film on said semiconductor substrate;

polishing said insulating film using the chemical mechanical polishing until said first or second stopper is exposed to the outside, to form an insulating film buried in said trench isolating region; and peeling off said first and second stoppers.

6. A method for manufacturing a semiconductor device comprising the steps of:

forming a first oxide film on a semiconductor substrate;

laminating a first thin stopper on said first oxide film, said first stopper being used for a chemical mechanical polishing;

forming a second thin stopper on said first stopper, said second stopper having a lower oxidation rate than that of said first stopper;

forming a second oxide film on said second stopper;

patterning by using a resist;

anistropic etching said second oxide film, said second stopper and said first stopper in a trench isolating region, on the basis of said patterning;

oxidizing the side of said first stopper, after peeling off said resist, by using said second oxide film as a mask so that the width of said first stopper is less than the width of said second stopper due to a difference of oxidation rates between said first and second stoppers;

anisotropic etching said first oxide film and said semiconductor substrate in said trench isolating region by using said second oxide film as a mask on the basis of said patterning;

peeling off said second oxide film;

depositing an insulating film on said semiconductor substrate;

polishing said insulating film using the chemical mechanical polishing until said first or second stopper is exposed to the outside, to form an insulating film buried in said trench isolating region; and peeling off said first and second stoppers.

* * * * *